United States Patent [19]

Kurematsu et al.

[11] Patent Number: 4,981,340
[45] Date of Patent: Jan. 1, 1991

[54] METHOD AND APPARATUS FOR READOUT OF INFORMATION FROM DISPLAY PANEL

[75] Inventors: Katsumi Kurematsu, Kawasaki; Junichiro Kanbe; Tsutomu Toyono, both of Yokohama, all of Japan

[73] Assignee: Canon Kabushiki Kaisha, Tokyo, Japan

[21] Appl. No.: 376,941

[22] Filed: Jul. 7, 1989

Related U.S. Application Data

[63] Continuation of Ser. No. 56,662, Jun. 2, 1987, abandoned.

[30] Foreign Application Priority Data

Jun. 4, 1986 [JP] Japan .................................. 61-129803

[51] Int. Cl.$^5$ .............................................. G02F 1/13
[52] U.S. Cl. ................................. 350/333; 350/350 S; 340/784
[58] Field of Search ................ 350/331 R, 332, 333, 350/350 S; 340/765, 784, 805; 365/108

[56] References Cited

U.S. PATENT DOCUMENTS

| | | | |
|---|---|---|---|
| 4,070,663 | 1/1978 | Kanatani et al. | 350/333 |
| 4,367,924 | 1/1983 | Clark et al. | 350/334 |
| 4,548,474 | 10/1985 | Nagae et al. | 350/333 |
| 4,649,517 | 3/1987 | Kitazima et al. | 350/333 |
| 4,655,561 | 4/1987 | Kanbe et al. | 350/333 |
| 4,719,457 | 1/1988 | Kitazima et al. | 340/784 |

*Primary Examiner*—Stanley D. Miller
*Assistant Examiner*—Tai V. Duong
*Attorney, Agent, or Firm*—Fitzpatrick, Cella, Harper & Scinto

[57] ABSTRACT

A display panel comprises a liquid crystal device including a pixel which comprises opposite electrodes and a ferroelectric liquid crystal disposed therebetween, and optical detection means. The written state of the pixel, i.e., the written information on the display panel, is read out by applying a detection signal voltage to the pixel and detecting a polarization current, if any, caused by the application of the voltage.

10 Claims, 3 Drawing Sheets

METHOD AND APPARATUS FOR READOUT OF INFORMATION FROM DISPLAY PANEL

This application is a continuation of application Ser. No. 07/056,662 filed June 2, 1987, now abandoned.

FIELD OF THE INVENTION AND RELATED ART

The present invention relates to a method and an apparatus for readout of information from a display panel, particularly a display panel comprising a ferroelectric liquid crystal device.

Hitherto, a liquid crystal display utilizing a thermoelectrooptical effect of a smectic A-phase liquid crystal has been known as a type of liquid crystal display. In the display panel utilizing the thermo-electrooptical effect, there is adopted a method of reading out written information by detecting a difference in electrostatic capacitance between the uniaxial alignment state and the scattering state of a liquid crystal.

However, the display panel utilizing the thermo-electrooptical effect involves a problem of a slow writing speed and a problem that it requires a large apparatus so that it cannot be easily applied to a display unit used in a word processor or an electronic typewriter.

On the other hand, Clark et al have proposed a ferroelectric liquid crystal device capable of providing a display panel wherein written information is memorized as it is on the display panel.

In this ferroelectric liquid crystal device, however, only the direction of a dipole moment is inverted depending on transition between first and second stable orientation states, so that no difference is yielded in electrostatic capacitance. Accordingly, it is impossible to read out written information by detecting a difference in capacitance caused by difference in alignment states in the manner as described above. As a result, no method for reading out information from a display panel using a ferroelectric liquid crystal has been found at all. Especially, driving methods for ferroelectric liquid crystal panels have been proposed in U.S. Pat. No. 4,548,476, U.S. patent application Ser. No. 598,800, 670,905, 683,862, 691,761, 701,765, 714,618, 724,825, 763,432, 765,235, 818,702, 813,239, 819,070, 852,180, 865,867, 883,746, 891,584, etc. However, no method or apparatus for electrically reading information which has been written on a display panel by such methods, has been disclosed.

SUMMARY OF THE INVENTION

An object of the present invention is to provide a novel information readout method, particularly a method for reading out information from a display panel using a ferroelectric liquid crystal device.

According to the present invention, there is provided an information readout method for a display panel which comprises a liquid crystal device including a pixel comprising opposite electrodes and a ferroelectric liquid crystal disposed therebetween, and optical detection means. The method comprises: applying a detection signal voltage to the pixel and detecting a polarization current, if any, caused by the application of the voltage, thereby to read out the written state of the pixel.

These and other objects, features and advantages of the present invention will become more apparent upon a consideration of the following description of the preferred embodiments of the present invention taken in conjunction with the accompanying drawings.

DETAILED DESCRIPTION OF PREFERRED EMBODIMENTS

Figure 1:
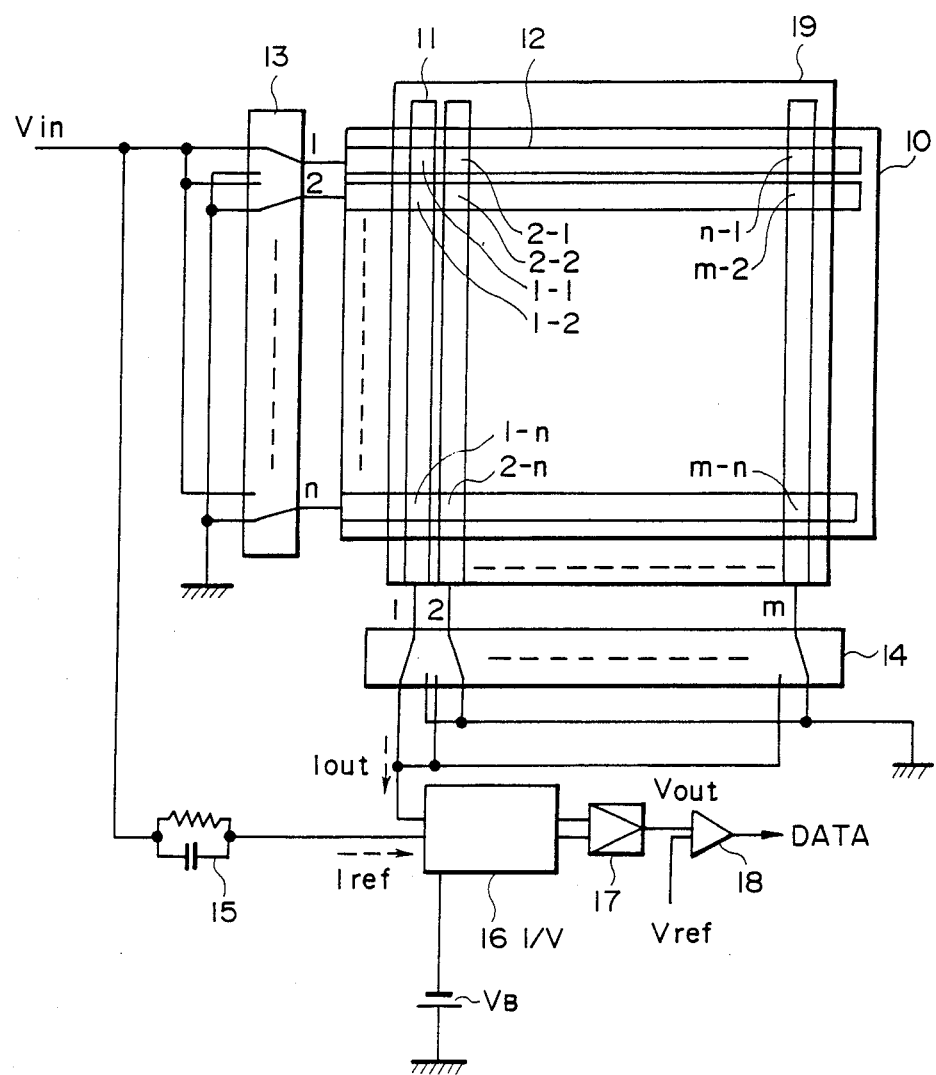
FIG. 1 is a diagram of an information readout circuit used in the present invention.

FIG. 1 shows an apparatus including a readout circuit for a ferroelectric liquid crystal display panel according to the readout method of the present invention. The apparatus includes data lines (signal electrodes) 11 formed on a substrate (glass plate) 19, scanning lines (scanning electrodes) 12 formed on a substrate (glass plate) 10, switches 13 for selectively supplying either a detection signal voltage $V_{in}$ or a ground potential to the respective scanning electrodes, switches 14 for selectively supplying a detection current $I_{out}$ to the respective signal electrodes, a pixel 15 in the white state expressed by its equivalent circuit, an I/V converter 16, a differential amplifier 17 and a comparator 18.

The above mentioned scanning electrodes and signal electrodes are formed of transparent electrodes of, e.g., ITO (indium-tin-oxide).

Between the substrates 19 and 10 is hermetically disposed a ferroelectric liquid crystal to form a cell structure. The liquid crystal material used herein may be particularly suitably be a chiral smectic liquid crystal having ferroelectricity. More specifically, a liquid crystal in chiral smectic C phase (SmC*), chiral smectic G phase (SmG*), chiral smectic F phase (SmF*), chiral smectic I phase (SmI*) or chiral smectic H phase (SmH*) may be used.

Details of ferroelectric liquid crystals are described in, e.g., "LE JOURNAL DE PHYSIQUE LETTRES" 36 (L-69) 1975, "Ferroelectric Liquid Crystals"; "Applied Physics Letters" 36 (11) 1980, "Submicro Second Bistable Electrooptic Switching in Liquid Crystals"; "Kotai Butsuri (Solid State Physics)" 16 (141) 1981, "Liquid Crystals", etc. In the present invention, ferroelectric liquid crystals disclosed in these publications may be used.

Examples of ferroelectric liquid crystal compounds include decyloxybenzylidene-p'-amino-2-methylbutylcinnamate (DOBAMBC), hexyloxybenzylidene-p'-amino-2-chloropropylcinnamate (HOBACPC), and 4-O-(2-methyl)-butylresorcylidene-4'-octylaniline (MBRA 8).

An especially preferred class of chiral smectic liquid crystals used in the liquid crystal device according to the present invention are those showing a cholesteric phase at a temperature higher than the temperature for giving a smectic phase. A specific example of such chiral smectic liquid crystal is a biphenyl ester type liquid crystal compound.

Figure 3:
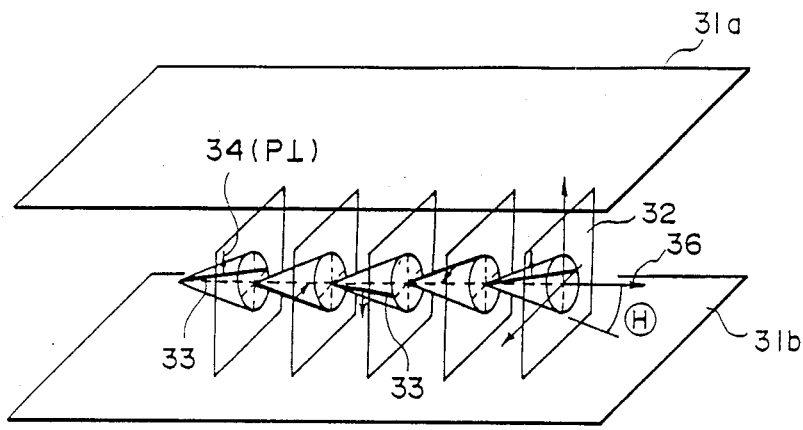
FIGS. 3 and 4 are perspective views respectively showing a ferroelectric liquid crystal device.

Referring to FIG. 3, there is schematically shown an example of a ferroelectric liquid crystal cell for explanation of the operation thereof. An example where an SmC* phase constitutes a desired phase is explained. Reference numerals 31a and 31b denote base plates (glass plates) on which a transparent electrode of, e.g., In$_2$O$_3$, SnO$_2$, ITO (Indium-Tin-Oxide), etc., is disposed, respectively. A liquid crystal of an SmC*-phase in which liquid crystal molecular layers 32 are aligned perpendicular to surfaces of the glass plates is hermetically disposed therebetween. Full lines 33 show liquid crystal molecules. The liquid crystal molecules 33 continuously form a helical structure in the direction of extension of the base plates. The angle formed between the central axis 35 and the axis of a liquid crystal molecule 33 is expressed as ⊕. Each liquid crystal molecule 33 has a dipole moment (P⊥) 34 in a direction perpendicular to the axis thereof. When a voltage higher than a certain threshold level is applied between electrodes formed on the base plates 31a and 31b, a helical structure of the liquid crystal molecule 33 is unwound or released to change the alignment direction of respective liquid crystal molecules 33 so that the dipole moments (P⊥) 34 are all directed in the direction of the electric field. The liquid crystal molecules 33 have an elongated shape and show refractive anisotropy between the long axis and the short axis thereof. Accordingly, it is easily understood that when, for instance, polarizers 35a and 35b arranged in a cross nicol relationship, i.e., with their polarizing directions crossing each other, are disposed on the upper and the lower surfaces of the glass plates as illustrated in FIG. 4, the liquid crystal cell thus arranged functions as a liquid crystal optical modulation device of which optical characteristics vary depending upon the polarity of an applied voltage.

The liquid crystal layer in the liquid crystal device of the present invention may be rendered sufficiently thin in thickness (e.g., less than 10μ). As the thickness of the liquid crystal layer is decreased, the helical structure of the liquid crystal molecules is loosened even in the absence of an electric field whereby the dipole moment assumes either of the two states, i.e., Pa in an upper direction 44a or Pb in a lower direction 44b as shown in FIG. 4. One half of the angle between the molecular axis 43a and the molecular axis 43b is referred to as a tilt angle θ, which is the same as half the apical angle of the cone of the helical structure. When an electric field Ea or Eb higher than a certain threshold level and different from each other in polarity as shown in FIG. 4 is applied to a cell having the above-mentioned characteristics, the dipole moment is directed either in the upper direction 44a or in the lower direction 44b depending on the vector of the electric field Ea or Eb. In correspondence with this, the liquid crystal molecules are oriented in either of a first stable state 43a and a second stable state 43b.

When the above-mentioned ferroelectric liquid crystal is used in a liquid crystal display, it is possible to obtain two advantages as briefly mentioned hereinbefore. First is that the response speed is quite fast. Second is that the orientation of the liquid crystal shows bistability. The second advantage will be further explained, e.g., with reference to FIG. 4. When the electric field Ea is applied to the liquid crystal molecules, they are oriented to the first stable state 43a. This state is stably retained even if the electric field is removed. On the other hand, when the electric field Eb of which direction is opposite to that of the electric field Ea is applied thereto, the liquid crystal molecules are oriented to the second stable state 43b, whereby the directions of molecules are changed. This state is similarly stably retained even if the electric field is removed. Further, as long as the magnitude of the electric field Ea or Eb being applied is not above a certain threshold value, the liquid crystal molecules are placed in the respective orientation states. Thus, the states 43a and 43b have a memory characteristic.

Figure 4:
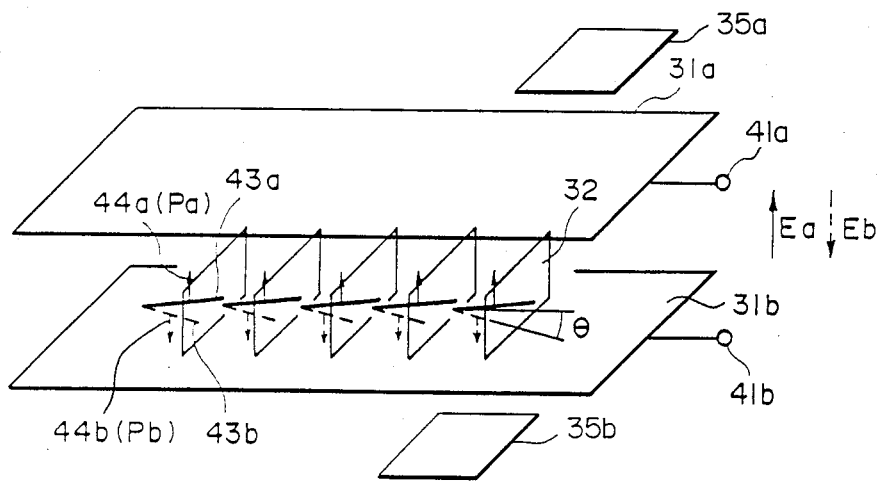

The voltage application means 41a and 41b in FIG. 4 correspond to a signal electrode 11 and a scanning electrode 12, respectively. A pair of polarizers 35a and 35b are so disposed that the first stable state given by the electric field Ea provides a visually "black" state and the second stable state given by the electric field Eb provides a "white" state. Hereinafter, the first stable state is referred to as a "black" state, the second stable state is referred to as a "white" state, and the change in orientation state from "black" to "white" is called "inversion".

Figure 2A:
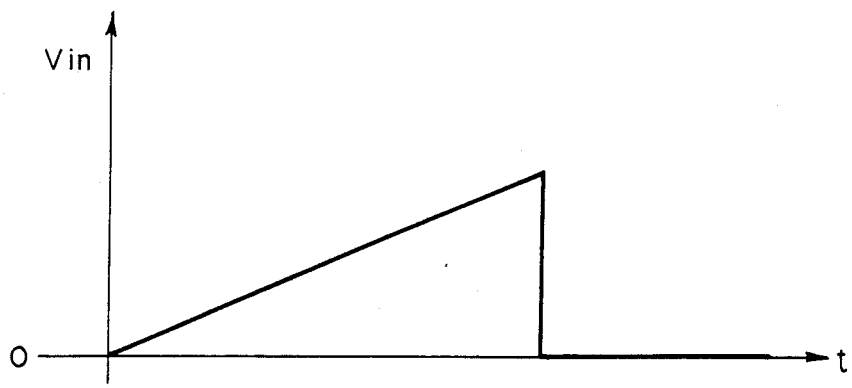
FIG. 2A is a pulse chart of an information detection signal voltage used in the method of the present invention.
Figure 2B:
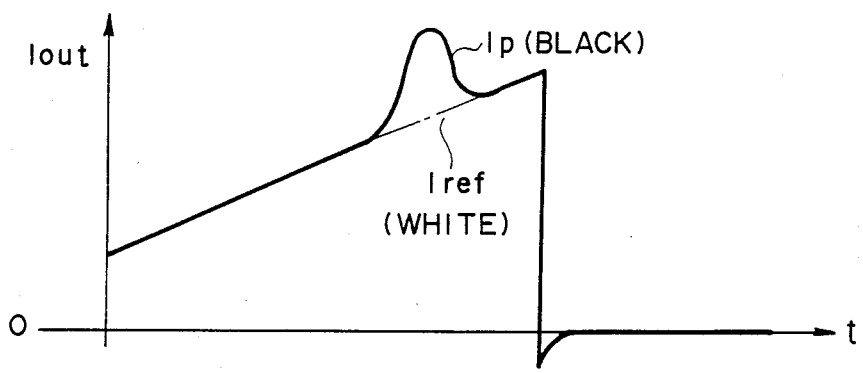
FIG. 2B is a current waveform chart showing a lump of polarization inversion current.
Figure 2C:
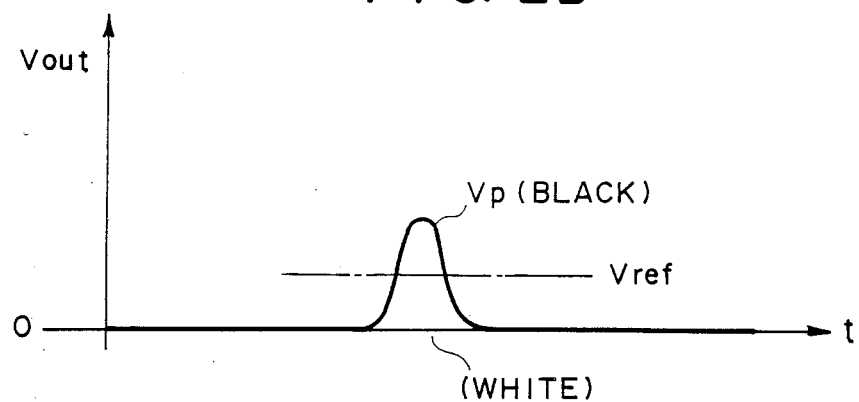
FIG. 2C is a voltage waveform diagram corresponding thereto.

The principle of the readout method according to the present invention is explained. For example, in order to read out the state of a 1—1-th pixel, a detection signal voltage $V_{in}$ comprising a certain rising voltage pulse below the threshold for inversion as shown in FIG. 2A is applied to the first scanning electrode, and a bias voltage $-V_B$ below the threshold for inversion is applied to the first signal electrode to detect a current $I_{out}$ flowing out to the electrode. The above mentioned detection signal voltage can be a falling voltage signal. The voltage $-V_B$ is applied through the I/V converter 16. At this time, the liquid crystal at the 1-1-th pixel is supplied with an upward electric field in the direction of Eb by the combination of $V_{in}$ and $-V_B$, so that when the electric field exceeds the threshold ($V_{in}$ and $V_B$ are set so that the sum $V_{in} + V_B$ exceeds the threshold), the pixel is, if it is in the "black" state, inverted into the white state. In the case of inversion of a ferroelectric liquid crystal as described above, a polarization inversion current $I_p$ due to the spontaneous polarization of the liquid crystal flows, the current $I_{out}$ issues out of the 1-1-th pixel in the black state is caused to assume a current waveform having a lump of the polarization inversion current $I_p$ as shown in FIG. 2B. On the other hand, when the pixel is in the white state, the orientation of the liquid crystal is not changed or no polarization inversion current flows, so that a current $I_{out}$ with no lump of $I_p$ denoted by $I_{ref}$ in FIG. 2 is detected. As a result, it is possible to read out the states of the respective pixels, i.e., image information, given on the display panel. In the above, the inversion of a pixel concerned is effected by the combination of $V_{in}$ and $-V_B$ each having a magnitude below the threshold, whereby inversion of the other pixels is prevented.

In order to judge the presence or absence of the polarization inversion current $I_p$, an equivalent circuit 15 corresponding to one pixel in the "white" state is provided so as to provide a reference detection current from the pixel in an actual matrix. Then, a reference current $I_{ref}$ obtained by applying the detection signal voltage $V_{in}$ and the bias voltage $-V_B$ to the equivalent circuit and the above mentioned detection current $I_{out}$ are respectively supplied to an I/V converter 16, wherein the currents are respectively converted to voltage signals which are then supplied to a differential amplifier 17. The output $V_{out}$ from the differential amplifier 17 provides a voltage waveform comprising a voltage corresponding to the subtraction of the detection current $I_{out}$ from the reference current $I_{ref}$, which appears only as a lump voltage waveform $V_p$ corresponding to the polarization inversion current $I_p$ if the detected pixel is in the "black" state. On the other hand, if the detected pixel is in the "white" state, the voltage waveform $V_p$ does not appear because there is no difference between the reference current $I_{ref}$ and the detection current $I_{out}$. Therefore, by comparing the output voltage $V_{out}$ with a reference voltage $V_{ref}$ by means of a comparator 18, the state of the detected pixel is consequently detected as the presence or absence of an output pulse from the comparator 18. The detected result is taken into a data bus at a prescribed time.

As for the sequence of readout, the detection signal voltage $V_{in}$ is first supplied continuously to the first scanning electrode, and in phase with the voltage $V_{in}$, the 1st to m-th switches 14 are successively turned on and off. As a result, the detection currents $I_{out}$ corresponding to the pixels 1-1 to m-1 are successively supplied to the I/V converter 16. Then, the above operation is repeated successively up to the n-th scanning electrode, whereby the states of all the pixels can be detected. In other words, the states of the pixels are detected point by point. At this time, the other scanning electrodes and signal electrodes may be grounded in order to prevent crosstalk.

The above mentioned polarization inversion current has the following relationship with the spontaneous polarization P of a ferroelectric liquid crystal:

$$\int I_p \, dt = 2P \cdot A,$$

wherein A denotes the electrode area of one pixel.

A display panel as described above was prepared for trial by forming signal electrodes and scanning electrodes of ITO films and by using DOBAMBC as the liquid crystal so as to have a picture size of 110 × 100 mm² with 11 × 10 pixels (on pixel/mm), and a cell thickness of 1μ. The readout operation was carried out by using the display panel and the above mentioned readout circuit, whereby a polarization inversion current $I_p$ with a peak value of about 10 μA was obtained and the readout was effected within 10 msec for one pixel. Further, all the pixels could be well read out but noise elimination wa required actually.

Incidentally, the above mentioned readout circuit is just an example, and any arrangement of circuit may be available as far as it is possible to detect the presence or absence of the above mentioned polarization inversion current $I_p$.

As described hereinabove, according to the present invention, it has become possible to read out displayed information on a liquid crystal display by detecting the polarization inversion voltage of a ferroelectric liquid crystal.

What is claimed is:

1. An information readout method for a display panel which comprises a liquid crystal device including a plurality of scanning lines and data lines, wherein one pixel formed at the intersection of the scanning line and the data line and a ferroelectric liquid crystal disposed therebetween, said method comprising the steps of:
   applying a detection signal voltage to the pixel and a reference pixel; and
   detecting a current waveform having a disturbance corresponding to a polarization inversion current caused by the application of the detection signal voltage, converting the current waveform and a reference detection current obtained from the reference pixel to two voltage waveforms and comparing the two voltage waveforms to provide a disturbed voltage waveforms corresponding to the disturbance of the inversion current, and detecting the disturbed voltage waveform, thereby to read out the written state of the pixel, wherein the detection signal voltage comprises a rising voltage pulse or a falling voltage pulse sufficient to cause an inversion of the ferroelectric liquid crystal from one orientation state to another orientation state at a voltage less than a maximum voltage of the detection signal voltage.

2. A method according to claim 1, wherein the scanning lines or data lines associated with the pixels in the rows not supplied with the detection signal voltage are grounded.

3. A method according to claim 1, wherein both the scanning lines and the data lines each not associated with the readout are grounded.

4. A method according to claim 1, wherein said ferroelectric liquid crystal comprises a chiral smectic liquid crystal.

5. A method according to claim 4, wherein said chiral smectic liquid crystal is disposed in a layer thin enough to release its own helical structure in the absence of an electric field.

6. An information readout apparatus comprising:
   a display panel comprising a liquid crystal device including a plurality of scanning lines and data lines, wherein one pixel formed at the intersection of the scanning line and the data line and a ferroelectric liquid crystal disposed therebetween;
   means for applying a detection signal voltage to the pixel and a reference pixel; and
   means for detecting a current waveform having a disturbance corresponding to a polarization inversion current caused by the application of the detection signal voltage, converting the current waveform and a reference detection current obtained from the reference pixel to two voltage waveforms and comparing the two voltage waveforms to provide a disturbed voltage waveform corresponding to the disturbance of the inversion current, and detecting the disturbed voltage waveform, thereby to readout the written state of the pixel, wherein the detection signal voltage comprises a rising voltage pulse or a falling voltage pulse sufficient to cause an inversion of the ferroelectric liquid crystal from one orientation state to another orientation state at a voltage less than a maximum voltage of said detecting signal voltage.

7. An apparatus according to claim 6, wherein the scanning lines or data lines associated with the pixels in the rows not supplied with the detection signal voltage are grounded.

8. An apparatus according to claim 6, wherein both the scanning lines and the data lines each not associated with the readout are grounded.

9. An apparatus according to claim 6, wherein said ferroelectric liquid crystal comprises a chiral smectic liquid crystal.

10. An apparatus according to claim 9, wherein said chiral smectic liquid crystal is disposed in a layer thin enough to release its own helical structure in the absence of an electric field.

* * * * *